United States Patent
Sakurai et al.

(10) Patent No.: US 10,790,250 B2
(45) Date of Patent: Sep. 29, 2020

(54) METHOD FOR MANUFACTURING SEMICONDUCTOR DEVICE

(71) Applicant: Panasonic Intellectual Property Management Co., Ltd., Osaka (JP)

(72) Inventors: Daisuke Sakurai, Osaka (JP); Takeru Tamari, Osaka (JP); Shozo Ochi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 1 day.

(21) Appl. No.: 16/211,611

(22) Filed: Dec. 6, 2018

(65) Prior Publication Data

US 2019/0181110 A1 Jun. 13, 2019

(30) Foreign Application Priority Data

Dec. 8, 2017 (JP) ................................ 2017-235640

(51) Int. Cl.
*H01L 23/00* (2006.01)
*H01L 21/027* (2006.01)

(52) U.S. Cl.
CPC .............. *H01L 24/11* (2013.01); *H01L 24/13* (2013.01); *H01L 21/0272* (2013.01); *H01L 2224/05568* (2013.01); *H01L 2224/11001* (2013.01); *H01L 2224/11003* (2013.01); *H01L 2224/11462* (2013.01); *H01L 2224/11472* (2013.01); *H01L 2224/13012* (2013.01); *H01L 2224/13014* (2013.01); *H01L 2224/13019* (2013.01); *H01L 2224/13144* (2013.01)

(58) Field of Classification Search
CPC ..... H01L 24/11–14; H01L 2224/11472; H01L 2224/11001; H01L 21/0272; H01L 2224/11462
See application file for complete search history.

(56) References Cited

U.S. PATENT DOCUMENTS

| | | | |
|---|---|---|---|
| 9,773,755 B2 * | 9/2017 | Shen | H01L 24/13 257/737 |
| 9,997,482 B2 * | 6/2018 | Lee | H01L 24/05 |
| 10,056,345 B2 * | 8/2018 | Kuo | H01L 24/16 |
| 10,121,754 B2 * | 11/2018 | Oliver | H01L 23/552 |
| 2007/0108591 A1 * | 5/2007 | Sunohara | H01L 21/486 257/700 |
| 2009/0104766 A1 | 4/2009 | Gomi et al. | |
| 2012/0040524 A1 * | 2/2012 | Kuo | H01L 24/13 438/614 |

(Continued)

FOREIGN PATENT DOCUMENTS

JP 4826924 11/2011

*Primary Examiner* — Bac H Au
(74) *Attorney, Agent, or Firm* — Wenderoth, Lind & Ponack, L.L.P.

(57) ABSTRACT

A method for manufacturing a semiconductor device includes: supplying a resist to a first surface of a semiconductor element having a plurality of electrode pads to cover the electrode pad surfaces; opening the resist on the electrode pad surfaces to expose the electrode pad surfaces from the resist; curing the resist by applying light or heat to the resist; forming bump electrodes on the electrode pad surfaces by filling a plating solution into the openings of the resist; and peeling the resist from the first surface of the semiconductor element.

13 Claims, 5 Drawing Sheets

(56) References Cited

U.S. PATENT DOCUMENTS

| | | | |
|---|---|---|---|
| 2012/0049346 A1* | 3/2012 | Lin | H01L 24/11 |
| | | | 257/737 |
| 2013/0313726 A1* | 11/2013 | Uehling | H01L 21/563 |
| | | | 257/777 |
| 2013/0341788 A1* | 12/2013 | Machida | H05K 1/11 |
| | | | 257/737 |
| 2014/0159235 A1* | 6/2014 | Odaira | H01L 24/13 |
| | | | 257/737 |
| 2015/0228551 A1* | 8/2015 | Oi | H01L 24/13 |
| | | | 257/737 |
| 2015/0279793 A1* | 10/2015 | Kuo | H01L 24/13 |
| | | | 257/737 |

* cited by examiner

METHOD FOR MANUFACTURING SEMICONDUCTOR DEVICE

TECHNICAL FIELD

The present invention relates to a method for manufacturing a semiconductor device and, more particularly, to a method for manufacturing a semiconductor device using a resist.

BACKGROUND ART

Recently, to facilitate increases in both the density of semiconductor elements and the number of pins of electrode terminals, narrower pitches and reduced areas are implemented in electrode terminals of semiconductor elements. Normally, in flip-chip mounting, bump electrodes such as solder bumps are formed on electrode terminals of semiconductor elements such as system LSIs, memories, and CPUs, and the semiconductor elements are brought into pressure contact with connection terminals of a mounting board in a face-down manner and heated to achieve bump connection for the mounting.

In a method that has been used for forming solder bumps on electrode terminals of a semiconductor element, solder is placed on electrodes by screen printing, dispensing, or electrolytic plating and is then heated to a solder melting point or higher in a reflow furnace to form protruding solder bumps.

However, because of recent requirements for narrowing of pitch between electrodes becoming extremely severe, deformation of molten solder at a heating step during flip chip mounting has started causing problems such as occurrence of a solder bridge defect resulting in connection between the solder bumps due to the surface tension of the solder.

Therefore, in a proposed method, for example, tapered fine metal bumps made of gold or copper are used, and tips are plastically deformed at a face-down mounting step to achieve joining through solid-phase diffusion. According to this method, since the tapered fine metal bumps do not melt at the time of flip chip, the bridging can be prevented from occurring, and a narrow pitch can be made available.

Methods of forming a tapered fine metal bump include a gas deposition method in which fine particles and a carrier gas are injected to deposit fine metal particles (see, e.g., JP-4826924). FIGS. 5A to 5F are cross-sectional views conceptually showing a method of forming a fine metal bump according to an example described in JP-4826924.

As shown in FIG. 5A, an electrode 112 is formed on a substrate 110, and the electrode 112 is covered with a mask layer 130 made of a resin. The mask layer 130 has a recess 134 formed so that a predetermined position of the electrode 112 is exposed. An opening shape of the recess 134 is a circular shape.

Next, as shown in FIG. 5B, the substrate 110 placed on a metal plate is placed in a vacuum atmosphere of a gas deposition apparatus, and fine metal bumps are formed by a gas deposition method in which metal fine particles acquired by evaporating metal are sprayed from a nozzle 125 together with a carrier gas and deposited at the predetermined position.

By continuously spraying the metal fine particles from the nozzle 125, as shown in FIGS. 5C and 5D, while the metal bumps 114a are deposited and formed on the electrode 112 on a bottom surface of the straight-shaped recess 134, a tip of a metal film 132 deposited on the mask layer 130 increasingly overhangs from an opening edge of the straight-shaped recess 134 so that an opening portion of the straight-shaped recess 134 becomes narrower. Therefore, an amount of the metal fine particles deposited on the exposed surface of the electrode 112 also gradually decreases from an inner circumferential edge of the straight-shaped recess 134 toward the center, and a truncated cone-shaped metal bump 114a is formed.

As the spaying of the metal fine particles is further continued, as shown in FIG. 5E, the opening portion of the straight-shaped recess 134 is completely closed by a tip portion of the metal film 132 deposited on the mask layer 130. In this state, a cone-shaped metal bump 114 is independently formed on the exposed surface of the electrode 112 exposed on the bottom surface of the straight-shaped recess 134 without contact with the metal film 132.

The spraying of the metal particles and the carrier gas from the nozzle 125 is stopped, and as shown in FIG. 5F, the substrate 110 is taken out from the gas deposition apparatus to mechanically peel off the mask layer 130 and the metal film 132 from one side of the substrate 110 while maintaining the shape of the cone-shaped metal bump 114. As a result, the metal bump 114 is formed along an outer circumferential edge of the substrate 110.

According to this example, a method of forming a fine metal bump can be provided so that a fine metal bump may stably and industrially be formed at a predetermined portion of a metal member formed on one side of a substrate.

However, according to the conventional method, to form a cone-shaped metal bump, metallic fine particles and a carrier gas must be sprayed from a nozzle to an electrode portion for each bump. To form a multiplicity of bumps on a wafer having a large number of pins and a large diameter, the entire surface of the wafer must be scanned to spray the metal fine particles and the carrier gas, which causes a problem of a long production time. Moreover, it is difficult to provide control to make a flow rate of gas spray uniform in multiple opening portions on the entire wafer surface, which causes a problem of variations in shape of bumps.

Furthermore, since the deposited metal film 132 is peeled off at the same time as the mask layer 130, it is necessary to discard or recover the metal film 132 made of an expensive metal such as gold or platinum, which causes a problem of raised production costs.

In view of the problems described above, an object of the present invention is to provide a method for manufacturing a semiconductor device in which a minute bump electrode can be manufactured in a short production time with a stable shape ensured at a lower cost in semiconductor elements increasingly having a larger number of pins and a larger diameter.

SUMMARY OF THE INVENTION

A method for manufacturing a semiconductor device according to one aspect of the present invention includes, supplying a resist to a first surface of a semiconductor element having a plurality of electrode pads to cover the electrode pad surfaces; opening the resist on the electrode pad surfaces to expose the electrode pad surfaces from the resist; curing the resist by applying light or heat to the resist; forming bump electrodes on the electrode pad surfaces by filling a plating solution into the openings of the resist; and peeling the resist from the first surface of the semiconductor element.

A method for manufacturing a semiconductor device according to another aspect of the present invention includes: supplying a resist to a first surface of a semiconductor element having a plurality of electrode pads such that the electrode pads are exposed so as to form openings of the resist on the electrode pad surfaces; curing the resist by applying light or heat to the resist; forming bump electrodes on the electrode pad surfaces by filling a plating solution into the openings of the resist; and peeling the resist from the first surface of the semiconductor element.

Effect of the Invention

According to the method for manufacturing a semiconductor device of the present invention, a method of forming a minute bump electrode can be provided in which a minute bump electrode can be manufactured in a short production time with a stable shape ensured at a lower cost in semiconductor devices increasingly having a larger number of pins and a larger diameter.

DETAILED DESCRIPTION OF THE INVENTION

Figure 1A:
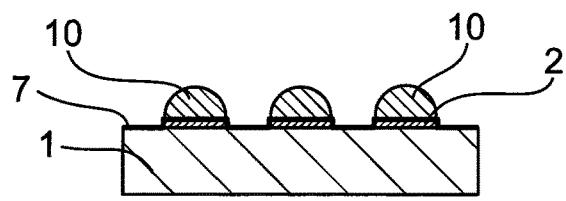
FIGS. 1A-1G are cross-sectional views for explaining a method of manufacturing a semiconductor device according to a first embodiment of the present invention.

A method for manufacturing a semiconductor device according to one aspect of the present invention includes, supplying a resist to a first surface of a semiconductor element having a plurality of electrode pads to cover the electrode pad surfaces; opening the resist on the electrode pad surfaces to expose the electrode pad surfaces from the resist; curing the resist by applying light or heat to the resist; forming bump electrodes on the electrode pad surfaces by filling a plating solution into the openings of the resist; and peeling the resist from the first surface of the semiconductor element.

In the opening the resist, the openings may be formed by pressing a nanoimprint transfer mold against the resist.

In the opening the resist, the openings may be formed so that bottom portions of the openings of the resist are made wider than entry portions.

The method may further include forming a resin layer on the electrode pad surfaces before the supplying the resist, wherein in the supplying the resist, the resist is supplied to the first surface of the semiconductor element to cover the resin layer formed on the electrode pad surfaces, and in the opening the resist, the resist and the resin layer on the electrode pad surfaces are removed to expose the electrode pad surfaces to form the openings.

In the opening the resist, after opening the resist on the resin layer to expose the resin layer, the resin layer may be removed through the openings to form the openings of the resist on the electrode pad surfaces.

In the opening the resist, a dissolution liquid may be injected into the openings of the resist in an amount not exceeding the depth of the openings to dissolve inner walls of the openings of the resist so that the bottom portions of the openings of the resist are made wider than the entry portions.

A method for manufacturing a semiconductor device according to another aspect of the present invention includes: supplying a resist to a first surface of a semiconductor element having a plurality of electrode pads such that the electrode pads are exposed so as to form openings of the resist on the electrode pad surfaces; curing the resist by applying light or heat to the resist; forming bump electrodes on the electrode pad surfaces by filling a plating solution into the openings of the resist; and peeling the resist from the first surface of the semiconductor element.

In the supplying the resist, after a first resist layer having first openings in portions corresponding to the electrode pad surfaces may be disposed on the first surface of the semiconductor element by transfer of nanoimprint, a second resist layer having second openings smaller in size than the first openings of the first resist layer is disposed and stacked on the first resist layer.

An embodiment of the present invention will now be described with reference to the drawings.

First Embodiment

FIG. 1(1A-1G) shows a method of manufacturing a semiconductor device according to a first embodiment of the present invention. Description will hereinafter be made. As shown in FIG. 1A, multiple electrode pads 2 are formed on a first surface that is an upper surface of the semiconductor element 1 in the figures. After a seed layer 7 is formed to cover the entire first surface on which the electrode pads 2 are formed, a volatile resin layer 10 is disposed on each of the electrode pads 2 (resin layer forming step).

The seed layer 7 is used as an underlaying layer for forming electroplating. For example, the seed layer 7 is made of Ni, W, Cr, Cu, Co, or Ti and may have a thickness of 0.02 to 2 μm.

The volatile resin layer 10 is formed by a method such as nanoimprint, inkjet, photolithography, needle transfer, application, printing, etc., followed by a curing reaction allowed to progress by light irradiation or heating until the layer behaves as an elastic body.

Figure 1B:
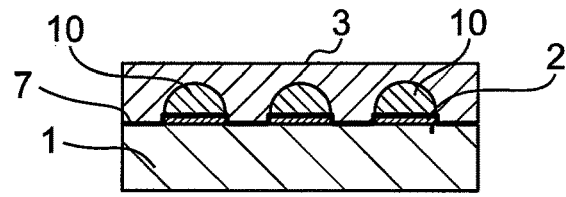

As shown in FIG. 1B, on the first surface of the semiconductor element 1, a resist 3 is disposed to cover each of the electrode pads 2 and the resin layers 10 (resist step). The resist 3 is formed by using, for example, spin coating or a bar coater such that a film becomes uniform. The resist 3 to be used may be of a photosensitive type, a thermosetting type, or a light/heat combination type. The resist 3 is preferably supplied to the substantively the entire first surface of the semiconductor element 1.

Figure 1C:
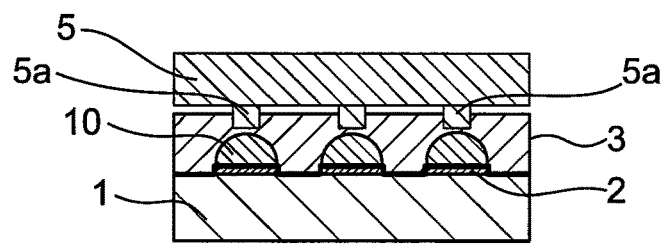

Subsequently, as shown in FIG. 1C, a nanoimprint mold 5 provided with multiple protrusions 5a facing the respective electrode pads 2 is aligned with the electrode pads 2 of the semiconductor element 1. The respective protrusions 5a of the nanoimprint mold 5 are then pressed against and into the resist 3 to pressurize the resist 3 until the resist 3 is pushed away in portions against which the protrusions 5a are pressed so that the protrusions 5a come in contact with (against) the volatile resin layer 10. While the resist 3 is pressurized by the nanoimprint mold 5, the resist 3 is cured by light irradiation or heating (curing step).

The nanoimprint mold 5 is a transfer mold of nanoimprint and may be made of a resin such as acrylic, silicone, and epoxy, for example. Since the nanoimprint mold 5 is deformable and deforms at the time of pressurization, warpage and undulation of the semiconductor element 1 can be absorbed (adapted to), and opening portions described later can uniformly be formed on the entire surface of the semiconductor element 1.

Figure 1D:
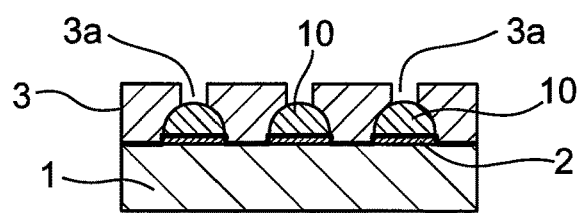

Subsequently, by peeling off the nanoimprint mold 5 from the semiconductor element 1, as shown in FIG. 1D, opening portions 3a are disposed on the volatile resin layer 10. A releasing layer may be formed on a surface of the nanoimprint mold 5. For the release layer, for example, a resin such as silicone, fluorine, and acrylic resins or a metal film such as a nickel film may be used. By forming the release layer, the nanoimprint mold 5 can easily peeled off from the resist 3 and the resin layer 10.

Figure 1E:
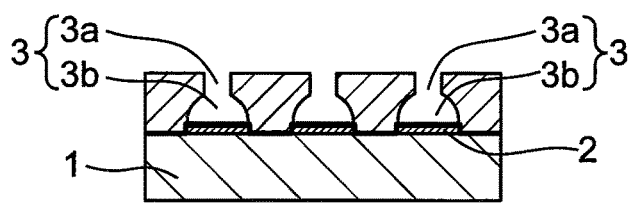

Subsequently, the semiconductor element 1 is immersed in a dissolution liquid so that the liquid enters the opening portions 3a of the resist 3 of the semiconductor element 1. As a result, only the volatile resin layer 10 is selectively dissolved while the resist 3 is not dissolved, so that the resin layer 10 is removed through the opening portion 3a. The semiconductor element 1 is then cleaned with a cleaning liquid and dried. As shown in FIG. 1E, openings are formed such that each of electrode pad surfaces (the surface of the electrode pad 2) is exposed from the resist 3 due to absence of the resist 3 on electrode pad surfaces (opening step). These openings are each formed by communication between an opening portion 3b corresponding to a portion where the resin layer 10 was present and an opening portion 3a of the resist 3 formed by the protrusion 5a of the nanoimprint mold 5. A size of the opening portion 3b in a direction along the first surface of the semiconductor element 1 is made larger than a size of the opening portion 3a. The bottom portion side of the opening of the resist 3 corresponds to the opening portion 3b, and the entry portion side corresponds to the opening portion 3a.

Figure 1F:
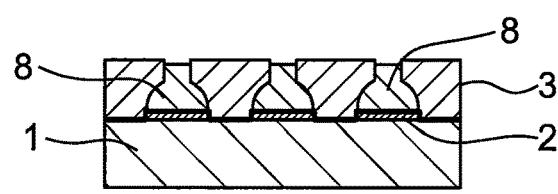
Figure 1G:
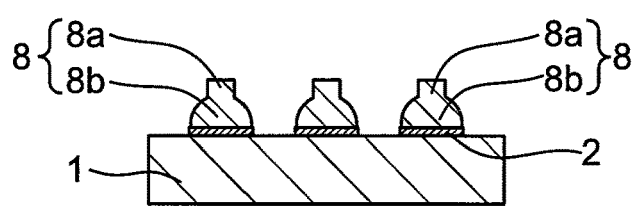

Subsequently, with a plating solution filled in the openings (opening portions 3a and 3b) of the resist 3, electrodes are connected to the seed layer 7 to perform electrochemical plating. As a result, as shown in FIG. 1F, plating bumps 8 described as an example of bump electrodes are formed in the openings (the openings 3a, 3b) of the resist 3 on the surface of the electrode pad 2 (plating step).

Subsequently, the semiconductor element 1 is immersed in a stripping liquid for the resist 3, and the resist 3 is peeled off from the first surface of the semiconductor element 1 (peeling step). The seed layer 7 is also peeled off from the first surface of the semiconductor element 1. This leads to completion of a semiconductor device with the plating bumps 8 formed on the respective electrode pads 2 of the semiconductor element 1. For example, alcohol, ethanol, acetone, pure water, etc. may be used as the stripping liquid for the resist 3. The seed layer 7 may be peeled off by using, for example, wet etching with a stripping liquid such as hydrofluoric acid, hydrochloric acid, and nitric acid, or a dry etching method such as ashing.

The plating bumps 8 each have a top portion 8a and a base portion 8b. The top portion 8a is determined by the shape of the opening portion 3a, i.e., the shape of the protrusion 5a of the nanoimprint mold. Therefore, the respective top portions 8a can be formed such that when cut along a plane parallel to the first surface of the semiconductor element 1, cross sections have more uniform shape and size. For example, when the cross-sectional shape is a circle, a quadrangle, a hexagon, or an octagon, the top portions 8a have a three-dimensional shape such as a cylinder, a quadrangular prism, a hexagonal prism, or an octagonal prism. On the other hand, the base portion 8b tends to depend on the shape of the opening portion 3b, i.e., the shape of the volatile resin layer 10, and has a shape with certain roundness and slope. The plating solution is filled in the opening of the resist 3 in which the opening portion 3a and the opening portion 3b of the resist 3 are connected, and the plating bump 8 is formed by plating. Therefore, no bonded interface exists between the top portion 8a and the base portion 8b, so that favorable strength can be ensured for the plating bump 8.

The top portion 8a is narrower than the base portion 8b in size (e.g., diameter) in a direction along the first surface of the semiconductor element 1. Therefore, at a mounting step of the semiconductor device, the top portion 8a is compressed and deformed while expanding in a lateral direction, so that the warpage/undulation of the semiconductor element 1 and the substrate (not shown) can be absorbed, which provides a function of achieving reliable contact between the plating bumps 8 and electrodes of the substrate.

Preferably, a material used for the resist 3 has a solubility parameter (SP value) separated by 1 or more from the solubility parameter of the volatile resin layer 10. If the value is separated by less than 1, an inner wall portion of the opening portion of the resist 3 starts dissolving simultaneously with the dissolution of the volatile resin layer 10, resulting in an unstable shape. If the value is separated by 1 or more, only the volatile resin layer 10 can substantially selectively be dissolved.

For the volatile resin layer 10, instead of selecting a material soluble in the dissolution liquid, a material sublimating at or below the heatproof temperature of the resist 3 may be used. According to this method, the volatile resin layer 10 volatilizes at the curing step of the resist 3, so that the opening portion 3b of the resist 3 as shown in FIG. 1E can be formed. This eliminates the need for separately performing a dissolution step of the volatile resin layer 10 so that a residue of the volatile resin layer 10 can hardly remain. For example, when fine/multi-pin bumps are formed, a stable bump shape can be ensured. Additionally, a sublimed component adheres to the inner wall of the opening portion of the resist 3 to form a nanometer-order hydrophilic film. Therefore, even if an opening has a shape making it difficult for a solution to enter such as a narrow entry portion, a wide bottom portion, and a minute opening portion, the plating solution sufficiently permeates, and a stable plating bump can be formed without a void.

The seed layer 7 does not need to be used. At the step of forming the volatile resin layer 10 of FIG. 1A, for example, a material having higher hydrophilicity with the volatile resin layer 10 than a portion near the electrode pad 2 of the semiconductor element 1 may be used as the electrode pad 2. As a result, even though the liquid volatile resin layer 10 is supplied to the entire first surface of the semiconductor element 1, the volatile resin layer 10 can selectively be formed on the electrode pad 2.

According to this method, the volatile resin layer 10 can stably formed on each of the electrode pads 2 even when the semiconductor element 1 has the fine and narrow-pitch electrode pads 2. The plating step may be performed by an electroless plating method. This enables formation of the plating bumps 8 even without the seed layer 7.

Figure 2A:
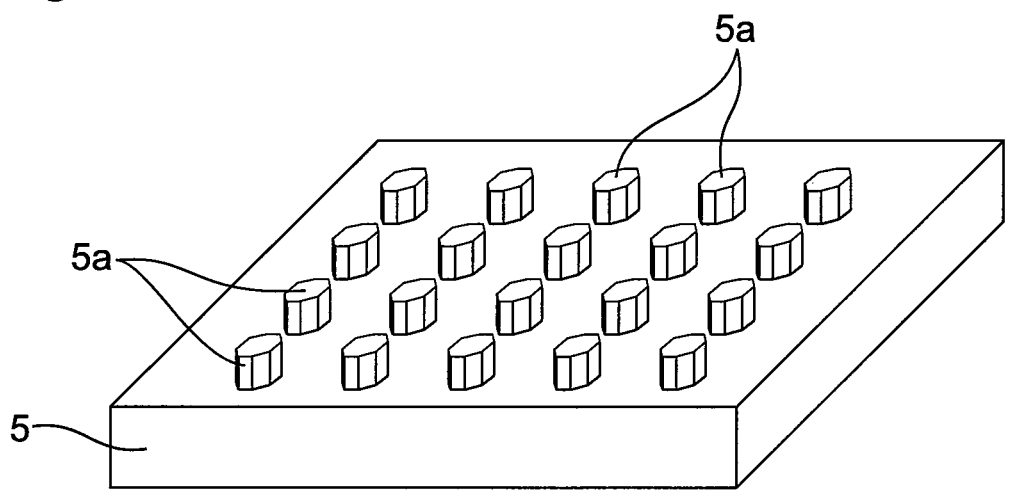
FIG. 2A is a three-dimensional view conceptually showing a nanoimprint mold according to the first embodiment.
Figure 2B:
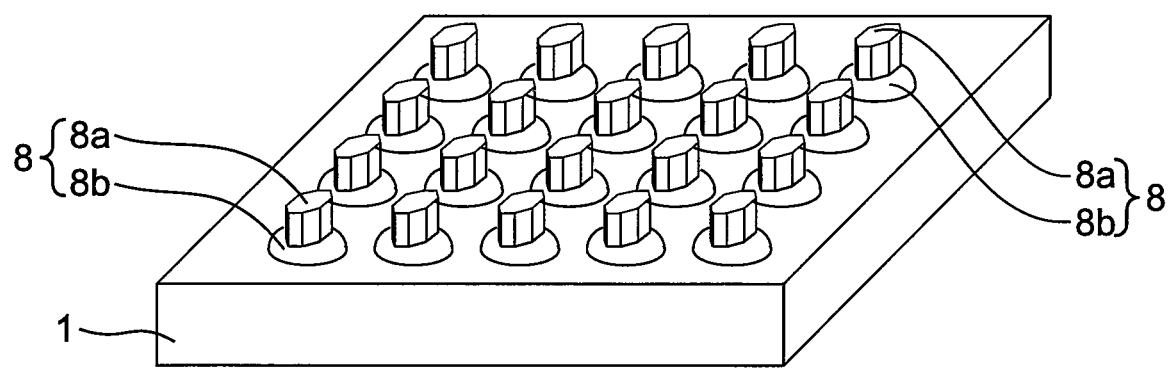
FIG. 2B is a three-dimensional view conceptually showing a semiconductor device having multiple bumps formed by the nanoimprint mold according to the first embodiment.

FIGS. 2A and 2B are three-dimensional views conceptually showing the nanoimprint mold 5 and the semiconductor element 1 according to the first embodiment of the present invention. As shown in FIG. 2A, for example, the multiple octagonal prism-shaped protrusions 5a are disposed at regular intervals on the surface of the nanoimprint mold 5.

FIG. 2B shows the bumps 8 formed by using the nanoimprint mold 5 of FIG. 2A. For example, the multiple bumps 8 made up of the dome-shaped base portions 8b and the octagonal prism-shaped top portions 8a are disposed at regular intervals on the semiconductor element 1. When a semiconductor device having such a configuration is mounted on a substrate (not shown), the narrow octagonal prism-shaped top portions 8a are compressed while expanding in the lateral direction to cause plastic deformation and are bonded to electrodes on the substrate side. Even though compressive deformation occurs, the narrow top portions 8a enables bonding without causing a short-circuit defect between adjacent bumps.

A semiconductor device was fabricated by the manufacturing method according to the first embodiment. The semiconductor element 1 was 1 mm×1 mm, and the electrode pads 2 had a pitch of 10 µm and a diameter of 5 µm. The volatile resin layer 10 having a diameter of 4 to 6 µm and a height of 2 µm was formed on the electrode pads 2. The resist 3 had a thickness of 6 µm. The protrusions 5a had a diameter of 3 µm and a height of 5 µm m, and openings (the opening portions 3a and 3B were formed in the resist 3 by the manufacturing method described above. As a result of observation of the shape by SEM through cross section polishing, it was confirmed that the openings of the resist 3 have the opening portions 3b with the maximum diameter of 6 µm as the bottom portions and the opening portions 3a with the maximum diameter of 3 µm as the entry portions and that the openings are formed in uniform shapes. As a result of electroplating using Au as a plating material, it was confirmed that the bumps 8 are 6 µm in height and have the octagonal prismatic top portions 8a and the round base portions 8b.

As described above, according to the first embodiment of the present invention, bumps can easily and stably be formed while ensuring high productivity even in the case of minute multi-pin bumps.

Second Embodiment

FIG. 3(3A-3F) shows a method of manufacturing a semiconductor device according to a first embodiment of the present invention. Description will hereinafter be made. First, as shown in FIG. 3A, the multiple electrode pads 2 are disposed on the first surface that is the upper surface of the semiconductor element 1 in the figures. For example, the electrode pad 2 may have various shapes such as a quadrangle, an octagon, a circle in planar view.

The first nanoimprint mold 5 is a transfer mold of nanoimprint and has the protrusions 5a disposed such that formation positions of the multiple electrode pads 2 are avoided when the mold faces the first surface of the semiconductor element 1. Therefore, the protrusions 5a are disposed on the first nanoimprint mold 5 such that the protrusions 5a face a peripheral region surrounding each of the electrode pads 2 while the first nanoimprint mold 5 faces the first surface of the semiconductor element 1. For example, if the quadrangular electrode pads 2 are arranged in a matrix shape on the first surface of the semiconductor element 1, the protrusions 5a have a shape corresponding to a lattice-shaped peripheral region surrounding each of the electrode pads 2.

First, a resist transferred to the semiconductor element 1 is formed on a transfer plate (not shown) to have a constant film thickness. The nanoimprint mold 5 is then pressed against this resist to transfer a first resist 13a to the protrusions 5a of the nanoimprint mold 5. Subsequently, the nanoimprint mold 5 is allowed to face the semiconductor element 1 and aligned such that the protrusions 5a face the peripheral region surrounding each of the electrode pads 2. This alignment may be performed by a means such as image processing using a recognition mark 4 disposed on the first surface of the semiconductor element 1. Subsequently, the protrusions 5a of the nanoimprint mold 5 are brought close to and pressed against the first surface of the semiconductor element 1, so that the first resist 13a transferred to the protrusions 5a of the nanoimprint mold 5 is transferred to the first surface of the semiconductor element 1. Specifically, the first resist 13a is transferred to the peripheral region surrounding each of the electrode pads 2 on the first surface of the semiconductor element 1 to form a layer of the first resist 13a (first resist layer) having a first opening in a portion corresponding to a surface of each of the electrode pads 2 (resist step).

Figure 3A:
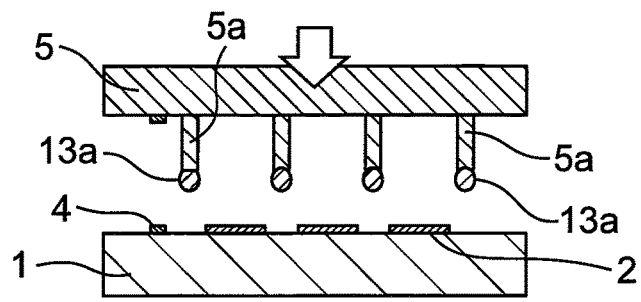
FIGS. 3A-3F are cross-sectional views showing a method of manufacturing a semiconductor device according to a second embodiment of the present invention.
Figure 3B:
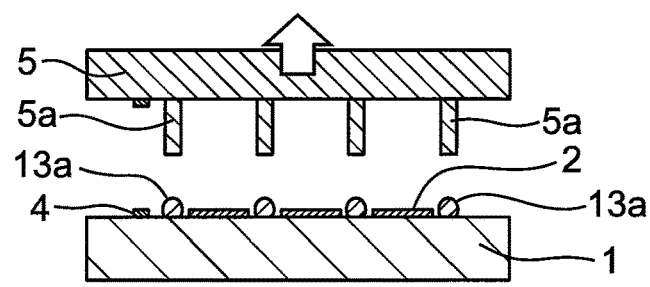

Subsequently, as shown in FIG. 3B, the first resist 13a transferred to the semiconductor element 1 is irradiated with light, or the first resist 13a is heated, to cure the first resist 13a (curing step).

Figure 3C:
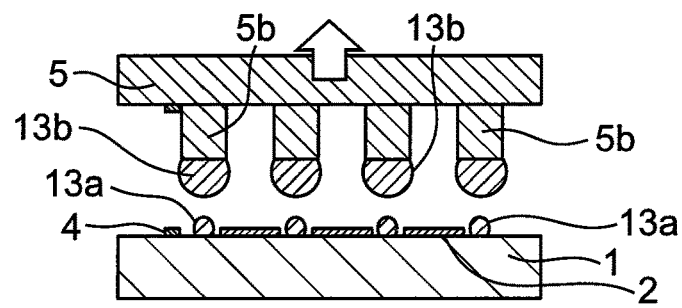

Subsequently, as shown in FIG. 3C, resist transfer is further performed by using the nanoimprint mold 5 provided with protrusions 5b having a larger cross-sectional area than the protrusions 5a. In the nanoimprint mold 5, the protrusions 5b are formed in substantially the same arrangement as the protrusions 5a. However, the protrusions 5b are different from the protrusions 5a in that the width of the cross-sectional area is larger. By using the nanoimprint mold 5 having the configuration as described above, a second resist 13b is transferred to the protrusions 5b with the same technique as the protrusions 5a, and the second resist 13b is transferred and stacked on the first resist 13a disposed on the semiconductor element 1 (resist step). A layer of the second resist 13b has a second opening in a portion corresponding to the surface of each of the electrode pads 2, and this second opening is an opening smaller than the first opening. Light irradiation or thermal curing is performed to form a resist 13 having the layers of the first resist 13a and the second resist 13b different in opening size stacked in the vertical direction as shown in FIG. 3D.

Figure 3D:
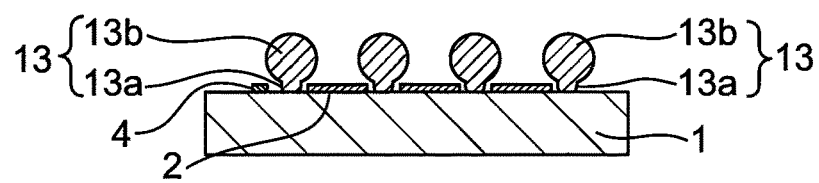
Figure 3E:
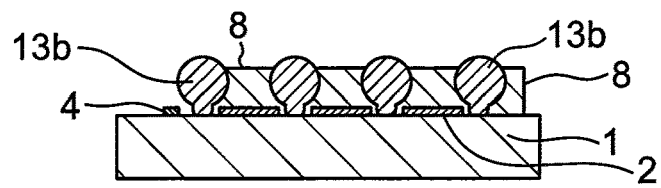

Subsequently, as shown in FIG. 3E, a plating solution is filled into openings on the electrode pads 2 formed by the resist 13, and the plating bumps 8 are formed on the electrode pad 2 by plating (plating step). Electroless plating method may be used for the plating. The material of the electrode pads 2 may be Al, Al—Cu, Al—Si—Cu, Cu, Au, or P—Al, for example, and the material of the plating bump 8 may be Cu, Au, Co, or W, for example.

Figure 3F:
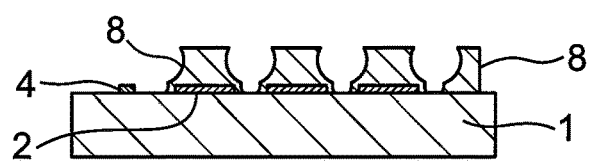

Lastly, the resist 13 is peeled off from the first surface of the semiconductor element 1 (peeling step) so as to form the protruding bumps 8 having base portions (portions on the electrode pad 2 side) larger in size than top portions (portions on the tip side) as shown in FIG. 3F.

As shown in FIG. 3D, an entry portion of the second opening in the resist 13b has a shape spreading upward. Therefore, even when the second opening has a minute size, the plating solution more easily flows in along the entry portion, so that the plating solution can be filled without generating a void portion.

Although the bump formation method using electroless plating has been described in the embodiment described above, the present invention is not limited thereto. As in the first embodiment, electroplating or electrochemical plating may be used by adding a seed layer forming step before forming the resist and a seed layer peeling step after peeling off the resist.

As described above, according to the second embodiment of the present invention, bumps can be formed while stabilizing the shape even in a semiconductor element having more pins and made finer as compared to the first embodiment.

Third Embodiment

FIG. 4(4A-4J) is a method of manufacturing a semiconductor device according to a third embodiment of the present invention. Description will hereinafter be made.

Figure 4A:
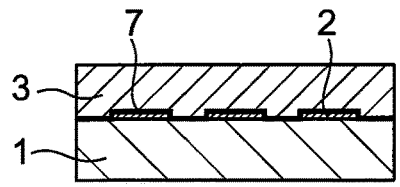
FIGS. 4A-4J are cross-sectional views for explaining a method of manufacturing a semiconductor device according to a third embodiment of the present invention.

As shown in FIG. 4A, after the seed layer 7 is formed to cover the entire first surface of the semiconductor element 1 provided with the electrode pads 2, the resist 3 is formed on the first surface. For example, the resist 3 is formed by using spin coating, a bar coater, a spray, or a jet dispensing method such that a film becomes uniform. The semiconductor element 1 is a disk-shaped wafer, for example.

Figure 4F:
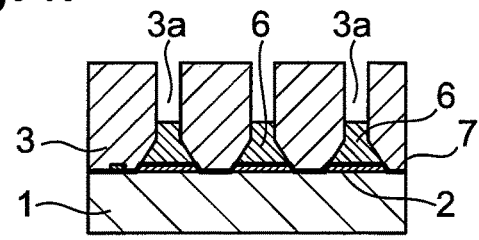
Figure 4B:
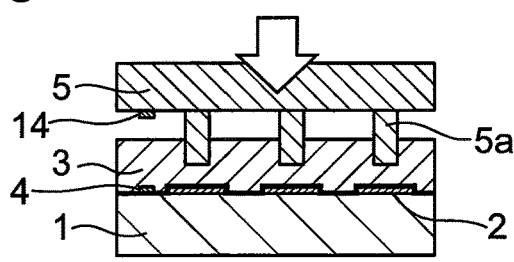

Subsequently, as shown in FIG. 4B, a recognition mark 14 disposed on the nanoimprint mold 5 is aligned with the recognition mark 4 of the semiconductor element 1. The nanoimprint mold 5 may have an outer shape dimension larger than the semiconductor element 1 in a planar view and may have a rectangular shape, for example.

Figure 4G:
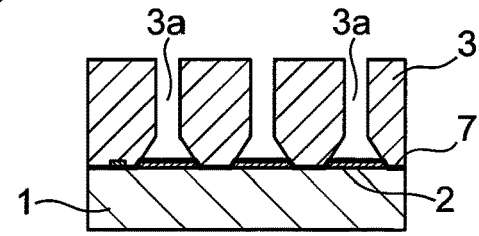
Figure 4C:
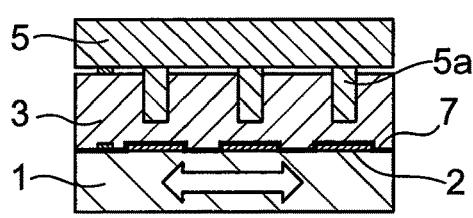

As shown in FIG. 4C, the protrusions 5a of the nanoimprint mold 5 is then pressed against the resist 3, and the protrusions 5a are brought into contact with the electrode pads 2 of the semiconductor element 1 while forming openings in the resist 3 (opening step). At this point, the resist 3 is in a gel state or has fluidity for example. The nanoimprint mold 5 is provided with the multiple protrusions 5a facing the electrode pads 2. For example, a shape such as a circle, a quadrangle, and an octagon may be used for the shape of the protrusions 5a. For a pressurizing means for the nanoimprint mold 5, for example, a roll press method etc. may be used.

Figure 4H:
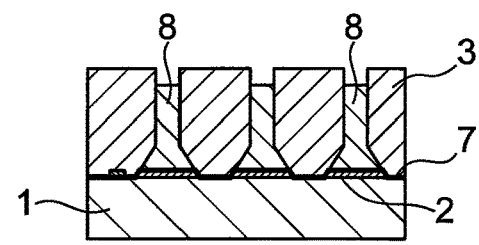
Figure 4D:
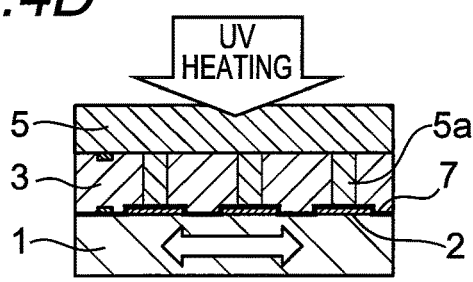

Subsequently, as shown in FIG. 4D, while the nanoimprint mold 5 is pressed against the electrode pad 2, the resist 3 is irradiated with light through the nanoimprint mold 5, which is followed by heating for curing the resist 3 (curing step).

Figure 4I:
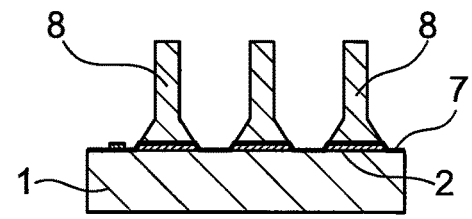
Figure 4E:
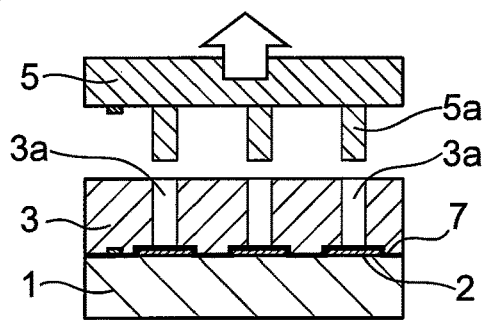

Subsequently, as shown in FIG. 4E, the nanoimprint mold 5 is pulled up, so that the fine opening portions 3a are formed in the resist 3 on the electrode pads 2.

For a means of pulling up the nanoimprint mold 5, for example, the following method may be used. After holding one end of the rectangular nanoimprint mold 5 with a jig, the nanoimprint mold 5 is pulled with a constant tension while the nanoimprint mold 5 is pressed by a pressing plate etc. By further pulling up the one held end of the nanoimprint mold 5 while moving the position of the pressing plate in the horizontal direction, the nanoimprint mold 5 can be pulled up in the vertical direction relative to the semiconductor element 1. The surface of the nanoimprint mold 5 including the protrusions 5a may be subjected to a releasing treatment with a heat-resistant releasing agent. This facilitates the pull-up after heating.

Subsequently, a liquid developer 6 is injected into the opening portions 3a of the resist 3 to dissolve inner walls of the opening portions 3a of the resist 3 and expand the opening portions 3a of the resist 3. By controlling an amount of the liquid developer 6 and injecting the liquid developer 6 so as not to exceed the depth of the opening portions 3a of the resist 3, the resist 3 in a bottom portion close to the first surface of the semiconductor element 1 is more easily dissolved in the liquid developer 6 than a surface layer portion of the resist 3 due to the gravity. This leads to formation of the resist 3 having the taper-shaped opening portions 3a with the top portions wider than the bottom portions.

Subsequently, as shown in FIG. 4G, the liquid developer 6 and a residue having entered the opening portions 3a of the resist 3 are removed with a cleaning liquid. For example, pure water, alcohol, ethanol, or acetone may be used as the cleaning liquid.

Subsequently, as shown in FIG. 4H, a plating solution is filled into the opening portions 3a of the resist 3, and the plating bumps 8 are formed by plating (plating step). For the plating bumps 8, for example, an alkaline bottom-up type filled plating may be used. The bottom portion of the resist is more dissolved by alkali than the surface layer portion, and the plating is deposited in a bottom-up manner while expanding an expansion diameter of the bottom portion. Since the inner walls of the opening portions 3a of the resist 3 are increased in wettability, the plating solution is more easily injected even though the opening portions 3a have a minute size, and the plating is formed in a bottom-up manner. Furthermore, as shown in FIG. 4I, the resist 3 is immersed in a resist stripping solution, and the resist 3 is peeled off from the first surface of the semiconductor element 1 (peeling step).

Figure 4J:
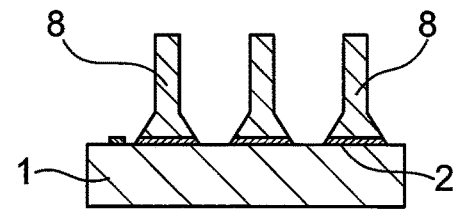
Figure 5A:
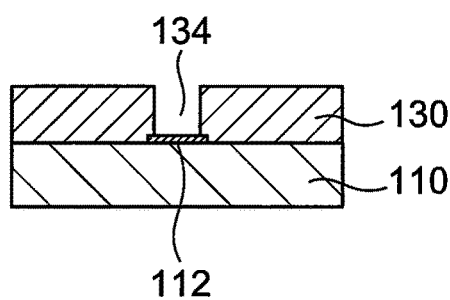
FIGS. 5A-5F are cross-sectional views conceptually showing a method of forming a fine metal bump according to an example described in Japanese Patent No. 4826924.
Figure 5B:
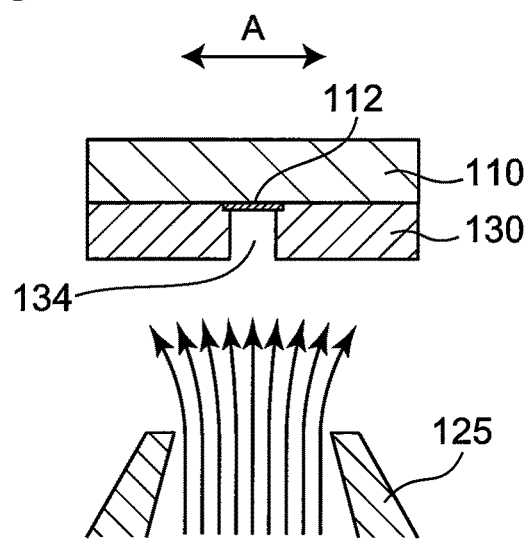
Figure 5C:
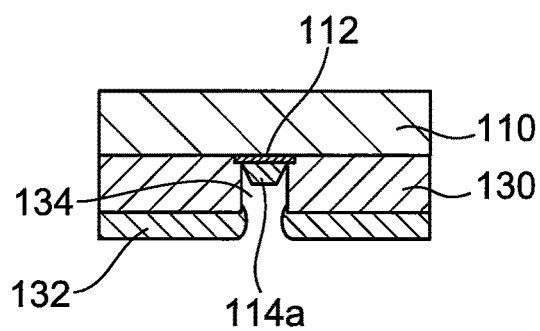
Figure 5D:
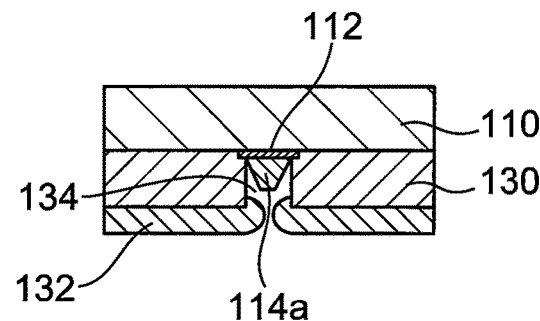
Figure 5E:
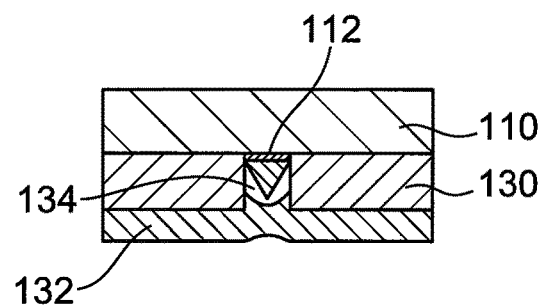
Figure 5F:
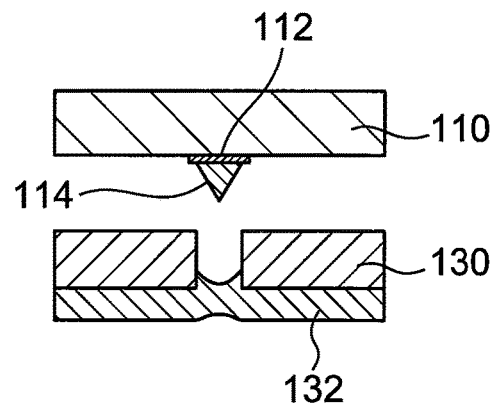

Lastly, as shown in FIG. 4J, by removing the seed layer 7 by wet etching or ashing treatment, the bumps 8 having the taper-shaped base portions are formed.

In FIG. 4F, instead of immersing in a large amount of the liquid developer 6, a measured amount of the liquid developer 6 may be dropped or sprayed while the semiconductor element 1 is rotated. Amounts of the liquid developer 6 filled in the multiple openings 3a can all be kept at a constant amount, and the diameter of the resist 3 to be dissolved can be stabilized.

In the developing method of FIG. 4F to FIG. 4G, a dry step may be used. The number of steps can be reduced, and an amount of air flow entering the fine openings can be stabilized, so that an effect of stabilizing the shape can be obtained.

As described above, by using the third embodiment, more minute and higher-aspect fine plating bumps can stably and highly-productively be formed.

(General Note)

The embodiments can be combined. Particularly, the first and third embodiments may partially be incorporated in each other.

The present invention provides a method for manufacturing a semiconductor device and a semiconductor device capable of stably and highly-productively producing multiple fine protruding bump shapes and is particularly useful in a mounting field of mounting semiconductor elements increasingly having a larger number of pins and a larger diameter.

EXPLANATIONS OF LETTERS OR NUMERALS 1 semiconductor element
2 electrode pad
3 resist
3a opening portion
3b opening portion
4 recognition mark 5 nanoimprint mold
5a protrusion
5b protrusion
6 liquid developer
7 seed layer
8 bump
8a top portion
8b base portion
10 volatile resin layer
13 resist
13a resist
13b resist
14 recognition mark
110 substrate
112 electrode
114 metal bump
114a metal bump
125 nozzle
130 mask layer
132 metal film
134 recess

The invention claimed is:

1. A method for manufacturing a semiconductor device comprising:
supplying a resist to a first surface of a semiconductor element having a plurality of electrode pads thereon so that the resist covers electrode pad surfaces of the electrode pads;
forming openings in the resist on the electrode pad surfaces to expose the electrode pad surfaces from the resist by pressing a deformable nanoimprint transfer mold into the resist and deforming the nanoimprint transfer mold to thereby absorb any warpage and undulation of the semiconductor element;
curing the resist by applying light or heat to the resist;
forming bump electrodes on the electrode pad surfaces by filling a plating solution into the openings of the resist; and
peeling the resist from the first surface of the semiconductor element.

2. The method for manufacturing a semiconductor device according to claim 1, wherein the openings are formed so that bottom portions of the openings of the resist closest to the first surface of the semiconductor element are made wider than entry portions.

3. The method for manufacturing a semiconductor device according to claim 1, further comprising forming a resin layer on the electrode pad surfaces before the supplying the resist,
wherein, in the supplying the resist, the resist is supplied to the first surface of the semiconductor element to cover the resin layer formed on the electrode pad surfaces,
wherein, after forming the openings in the resist, the resin layer on the electrode pad surfaces is removed to expose the electrode pad surfaces to form the openings, and
wherein the resist has a solubility parameter separated by at least 1 from a solubility parameter of the resin layer.

4. The method for manufacturing a semiconductor device according to claim 3, wherein, after the deformable nanoimprint transfer mold is pressed into the resist to form the openings in the resist and expose the resin layer, the resin layer is removed through the openings to form the openings of the resist on the electrode pad surfaces.

5. The method for manufacturing a semiconductor device according to claim 3, wherein, during the pressing of the deformable nanoimprint transfer mold into the resist and deforming the nanoimprint transfer mold, the deformable nanoimprint transfer mold is pressed against the resin layer on the electrode pad surfaces.

6. The method for manufacturing a semiconductor device according to claim 1, wherein in the opening the resist, after the deformable nanoimprint transfer mold is pressed into the resist to form the openings in the resist, a dissolution liquid is injected into the openings of the resist in an amount not exceeding the depth of the openings to dissolve inner walls of the openings of the resist so that bottom portions of the openings of the resist are made wider than entry portions.

7. The method for manufacturing a semiconductor device according to claim 1, wherein the nanoimprint transfer mold is made of one of acrylic, silicone, and epoxy.

8. The method for manufacturing a semiconductor device according to claim 1, wherein a releasing layer is formed on a surface of the nanoimprint transfer mold.

9. A method for manufacturing a semiconductor device comprising:
supplying a resist to a first surface of a semiconductor element having a plurality of electrode pads thereon by supplying the resist to regions between the electrode pads without supplying the resist onto the electrode pads such that the electrode pads are exposed to thereby form openings of the resist on electrode pad surfaces of the electrode pads;
curing the resist by applying light or heat to the resist;
forming bump electrodes on the electrode pad surfaces by filling a plating solution into the openings of the resist; and
peeling the resist from the first surface of the semiconductor element.

10. The method for manufacturing a semiconductor device according to claim 9, wherein, in the supplying the resist, a first resist layer having first openings in portions corresponding to the electrode pad surfaces is formed on the first surface of the semiconductor element by transfer of nanoimprint, and then a second resist layer having second openings smaller in size than the first openings of the first resist layer is formed and stacked on the first resist layer.

11. The method for manufacturing a semiconductor device according to claim 9, wherein the supplying of the resist only to regions between the electrode pads comprises providing the resist only on protrusions of a nanoimprint transfer mold to transfer the resist to the first surface of the semiconductor element.

12. The method for manufacturing a semiconductor device according to claim 9, wherein the protrusions of the nanoimprint transfer mold have a shape corresponding to a peripheral region surrounding each of the electrode pads so as to transfer the resist to only the peripheral region surrounding each of the electrode pads.

13. The method for manufacturing a semiconductor device according to claim 9, wherein the supplying the resist includes:
forming a first resist layer on the regions between the electrode pads by transferring the resist from a nanoimprint transfer mold to the regions, and
forming a second resist layer on the first resist layer by transferring the resist from a nanoimprint transfer mold to the first resist layer, the second resist layer being wider than the first resist layer with respect to the first surface of the semiconductor element.

* * * * *